(12) United States Patent
Gao et al.

(10) Patent No.: US 11,502,159 B2
(45) Date of Patent: Nov. 15, 2022

(54) TOUCH DISPLAY PANEL AND DISPLAY DEVICE

(71) Applicant: Xiamen Tianma Micro-Electronics Co., Ltd., Xiamen (CN)

(72) Inventors: Zhuan Gao, Shanghai (CN); Xinzhao Liu, Shanghai (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 17/478,714

(22) Filed: Sep. 17, 2021

(65) Prior Publication Data

US 2022/0005921 A1  Jan. 6, 2022

Related U.S. Application Data

(63) Continuation of application No. 16/917,382, filed on Jun. 30, 2020, now Pat. No. 11,152,453.

(30) Foreign Application Priority Data

Dec. 31, 2019 (CN) .......................... 201911417940.X

(51) Int. Cl.
  *H01L 27/32* (2006.01)
  *G06F 3/044* (2006.01)
  *G06F 3/041* (2006.01)

(52) U.S. Cl.
  CPC ........ *H01L 27/3288* (2013.01); *G06F 3/0412* (2013.01); *G06F 3/0445* (2019.05); *H01L 27/323* (2013.01); *G06F 2203/04112* (2013.01)

(58) Field of Classification Search
  CPC . H01L 27/3288; H01L 27/323; G06F 3/0445; G06F 3/0412; G06F 2203/04112
  See application file for complete search history.

(56) References Cited

U.S. PATENT DOCUMENTS

| 10,409,391 | B2* | 9/2019 | Silvanto ............... G06F 3/0231 |
| 2016/0103544 | A1* | 4/2016 | Filiz .................... G06F 3/0412 |
| | | | 345/174 |
| 2017/0102809 | A1* | 4/2017 | Son ..................... G06F 3/0412 |
| 2018/0081485 | A1* | 3/2018 | Shuma .................. G01L 1/142 |

FOREIGN PATENT DOCUMENTS

| CN | 103969892 A | 8/2014 |
| CN | 206059439 U | 3/2017 |

\* cited by examiner

*Primary Examiner* — Deeprose Subedi
(74) *Attorney, Agent, or Firm* — Alston & Bird LLP

(57) ABSTRACT

Provided are a touch display panel and a display device. The touch display panel includes a first substrate and a second substrate disposed opposite to the first substrate. In a non-display area, multiple first conductive structures and multiple metal wires are configured on one side of the first substrate facing to the second substrate, and multiple second conductive structures are configured on one side of the second substrate facing to the first substrate. Each first conductive structure is electrically connected to a respective second conductive structure. Each first conductive structure includes a first transmit electrode and a first gasket structure that is disposed between the first transmit electrode and the first substrate. The first transmit electrode is electrically connected to a metal wire and the respective one second conductive structure. The first gasket structure includes multiple first recessed portions.

20 Claims, 11 Drawing Sheets

TOUCH DISPLAY PANEL AND DISPLAY DEVICE

CROSS-REFERENCE TO RELATED APPLICATIONS

The present application is a continuation of U.S. application Ser. No. 16/917,382, titled "Touch Display Panel and Display Device" and filed on Jun. 30, 2020, which claims priority to Chinese Patent Application No. 201911417940.X, filed Dec. 31, 2019, the contents of both of which are hereby incorporated by reference in their entirety as though fully and completely set forth herein.

TECHNICAL FIELD

Embodiments of the present disclosure relate to the field of display technologies and, in particular, to a display panel and a display device.

BACKGROUND

In recent years, with the development of display panels, it has become more common to integrate a touch function into a display panel. There are mainly two types for integrating a touch structure into the display panel: an on-cell type and an in-cell type.

A display panel integrated with the touch function may be an organic light-emitting diode (OLED) display panel or a liquid crystal display (LCD) panel. For the organic light-emitting display panel, the in-cell type means that a touch structure is on one side of the encapsulation glass facing an array substrate. However, a touch drive chip that provides a touch signal to the display panel is generally disposed on one side of the array substrate. To transmit the touch signal to the touch structure, conductive structures are generally disposed on the array substrate and the encapsulation glass. A conductive structure on the array substrate is electrically connected to a touch drive chip through a metal wire, and a conductive structure on the encapsulation glass is electrically connected to the touch structure. When the cover glass is disposed opposite to the array substrate, the conductive structures on the array substrate and the encapsulation glass are electrically connected in contact so that the touch drive chip is electrically connected to the touch electrode.

However, in the related art, a conductive structure may be recessed due to manufacturing process, thus being higher in the periphery and lower in the middle of the glass. That is, the conductive structure has a non-planar conductive contact surface so that there is a small effective contact area between the conductive structure on the array substrate and the conductive structure on the encapsulation glass, thereby affecting the effective conduction between the conductive structure on the array substrate and the conductive structure on the encapsulation glass.

SUMMARY

The present disclosure provides a touch display panel and a display device.

In a first aspect, an embodiment of the present disclosure provides a touch display panel. The touch display includes: a first substrate and a second substrate opposite to each other, wherein a display area and a non-display area are formed on each of the first substrate and the second substrate.

In the non-display area of the first substrate, multiple first conductive structures and multiple metal wires are disposed on one side of the first substrate facing the second substrate, and multiple second conductive structures are disposed on one side of the second substrate facing the first substrate. Each first conductive structure is electrically connected to a respective second conductive structure. In the display area, multiple pixel units are disposed on the one side of the first substrate facing the second substrate, and touch electrodes are configured on the one side of the second substrate facing the first substrate. The multiple second conductive structures are electrically connected to the touch electrodes. The multiple metal wires are configured to transmit touch signals.

Each first conductive structure includes a first transmit electrode and a first gasket structure, and the first gasket structure is disposed between the first transmit electrode and the first substrate. The first transmit electrode is electrically connected to a metal wire and a second conductive structure. The first gasket structure includes multiple first recessed portions. A first support portion is disposed between two adjacent first recessed portions.

In a second aspect, an embodiment of the present disclosure further provides a display device. The display device includes the display panel of any embodiment of the present disclosure.

DETAILED DESCRIPTION

Figure 1:
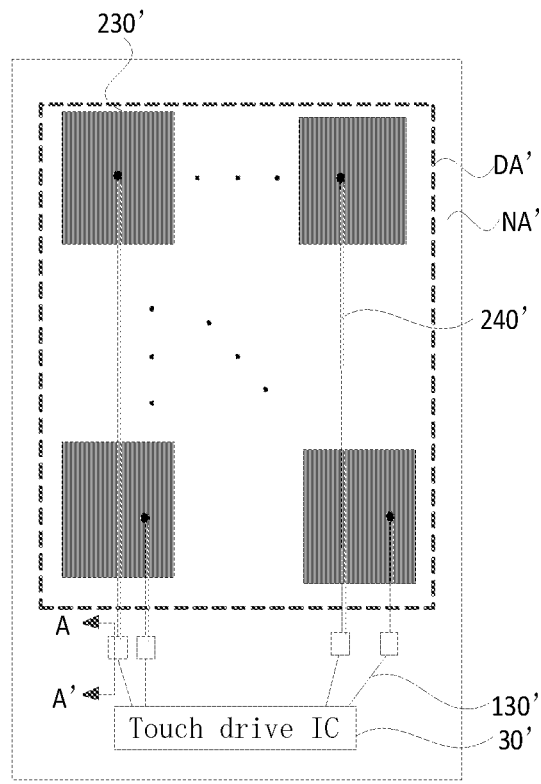
FIG. 1 is a structural diagram of a touch display panel according to the related arts.

Hereinafter the present disclosure will be further described in detail in conjunction with the drawings and embodiments. It is to be understood that the embodiments set forth herein are merely intended to illustrate and not to limit the present disclosure. Additionally, it is to be noted that for ease of description, merely part, not all, of the structures related to the present disclosure are illustrated in the drawings.

Figure 2:
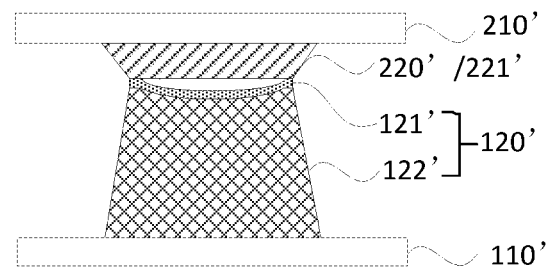
FIG. 2 is a cross sectional view taken along a section line A-A' of FIG. 1.

FIG. 1 is a structural diagram of a touch display panel according to the related art. FIG. 2 is a sectional view taken along a section line A-A' of FIG. 1. Referring to FIGS. 1 and 2, a touch display panel includes a display area DA', a non-display area NA', and a first substrate 110' and a second substrate 210' disposed opposite to the first substrate 110'. In the display area DA', multiple touch electrodes 230' are configured to be on one side of the second substrate 210' facing to the first substrate 110'. In the non-display area NA', multiple first conductive structures 120', multiple metal wires 130' and a touch drive chip 30' are configured to be on one side of the first substrate 110' facing to the second substrate 210'. The multiple first conductive structures 120' are connected to the touch drive chip 30' through the multiple metal wires 130'. Each first conductive structure 120' generally includes a first transmit electrode 121' and a first gasket structure 122' that is configured to raise the first transmit electrode 121'. The one side of the second substrate 210' facing to the first substrate 110' is provided with multiple second conductive structures 220'. The multiple second conductive structures 220' are electrically connected to the multiple touch electrodes 230' via touch wires 240'. Each second conductive structure 220' includes a second transmit electrode 221'. Since the first gasket structure 122' raises the first transmit electrode 121', the first transmit electrode 121' and the second transmit electrode 221' can be electrically connected in contact so that the multiple touch electrodes 230' are electrically connected to the touch drive chip 30', and thereby, touch signals generated by the touch drive chip 30' can be transmitted to the multiple touch electrodes 230'. However, the applicant has found that the first gasket structure 122' is generally formed by multiple stacked inorganic layers, metal layers and organic layers, and when the multiple inorganic layers have a greater thickness, the multiple inorganic layers are easily higher in the periphery and lower in the middle due to uneven stress so that the first transmit electrode 121' is easily recessed in the middle. That is, each first conductive structure 120' is in a recessed state. Thus, each first conductive structure 120' is in contact with a respective second conductive structure 220' only in the periphery, and thereby the effective conduction is affected.

In view of these, the present disclosure provides a touch display panel. The touch display includes a display area, a non-display area, and a first substrate and a second substrate disposed opposite each other.

In the non-display area, multiple first conductive structures and multiple metal wires are configured on one side of the first substrate facing to the second substrate, and multiple second conductive structures are configured on one side of the second substrate facing to the first substrate. Each first conductive structure is electrically connected to a respective second conductive structure. In the display area, multiple pixel units are configured on the one side of the first substrate facing to the second substrate, and touch electrodes are configured on the one side of the second substrate facing to the first substrate. The multiple second conductive structures are electrically connected to the touch electrodes. The multiple metal wires are configured to transmit touch signals.

Each first conductive structure includes a first transmit electrode and a first gasket structure, the first gasket structure is disposed between the first transmit electrode and the first substrate. The first transmit electrode is electrically connected to a metal wire and the respective one second conductive structure. The first gasket structure includes multiple first recessed portions. A first support portion is disposed between two adjacent first recessed portions.

The above is the core idea of the present disclosure, and technical solutions in the embodiments of the present disclosure will be described clearly and completely in conjunction with drawings in the embodiments of the present disclosure. On the basis of the embodiments of the present disclosure, all other embodiments obtained by those skilled in the art without creative work are within the scope of the embodiments of the present disclosure.

Figure 3:
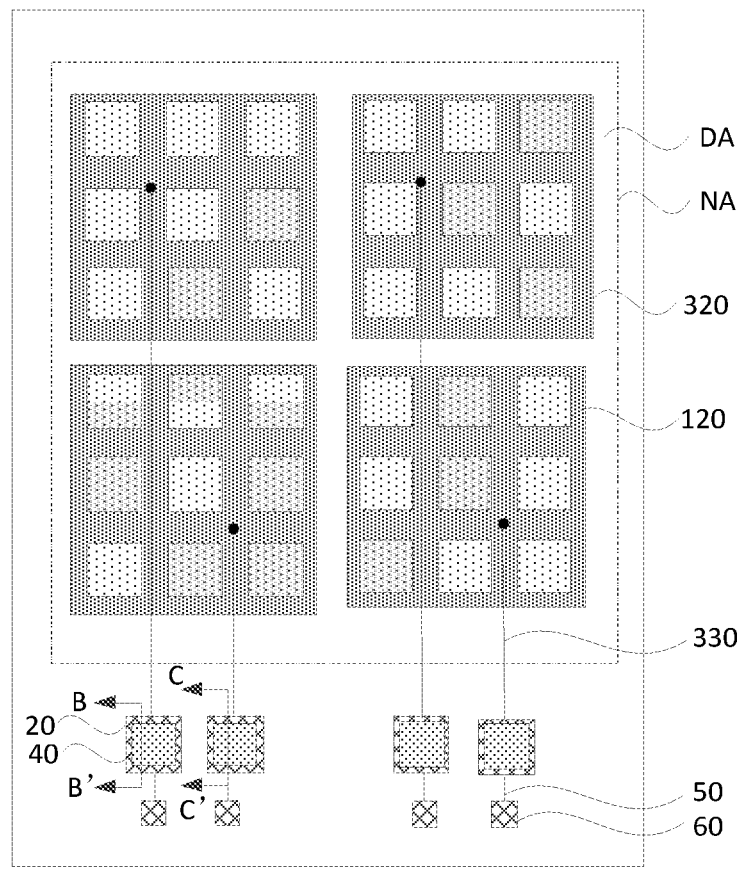
FIG. 3 is a structural diagram of a touch display panel according to an embodiment of the present disclosure.
Figure 4:
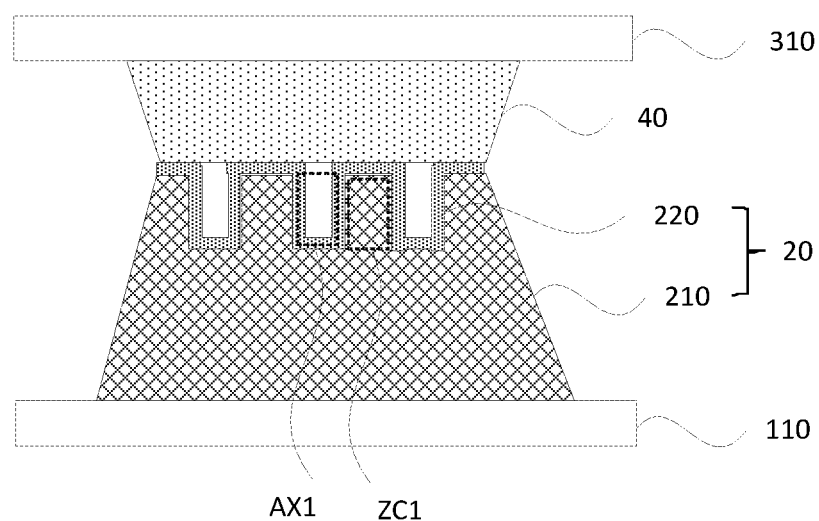
FIG. 4 is a cross sectional view taken along a section line B-B' of FIG. 3.

FIG. 3 is a structural diagram of a touch display panel according to an embodiment of the present disclosure. FIG. 4 is a cross sectional view taken along a section line B-B' of FIG. 3. Referring to FIGS. 3 and 4, the touch display panel includes a display area DA, a non-display area NA, and a first substrate 110 and a second substrate 310 disposed opposite to the first substrate 110. In the non-display area NA, multiple first conductive structures 20 and multiple metal wires 50 are configured on one side of the first substrate 110 facing to the second substrate 310, and multiple second conductive structures 40 are configured on one side of the second substrate 310 facing to the first substrate 110. Each first conductive structure 20 is electrically connected to a respective second conductive structure 40. In the display area DA, multiple pixel units 120 are configured on the one side of the first substrate 110 facing to the second substrate 310, and touch electrodes 320 are configured on the one side of the second substrate 310 facing to the first substrate 110. The multiple second conductive structures 40 are electrically connected to the touch electrodes 320. The multiple metal wires 50 are configured to transmit touch signals. Each first conductive structure 20 includes a first transmit electrode 220 and a first gasket structure 210 that is disposed between the first transmit electrode 220 and the first substrate 110. The first transmit electrode 220 is electrically connected to a metal wire 50 and the respective one second conductive structure 40. The first gasket structure includes multiple first recessed portions AX1. A first support portion ZC1 is disposed between two adjacent first recessed portions AX1.

Specifically, the display area DA may include multiple scan lines and multiple data lines. The multiple scan lines and the multiple data lines intersect to define multiple sub-pixel areas. Each sub-pixel area is provided with a sub-pixel. Each pixel unit 120 is composed of at least one sub-pixel. The multiple pixel units 120 are scanned line by line so that data signals can be written line by line. Then the multiple pixel units 120 are lightened line by line, and thereby a frame of picture is displayed.

Specifically, the display area DA may further include multiple touch electrodes 320. The multiple touch electrodes 320 are configured to detect a touch position of a user. FIG. 3 just shows the example of a display device with self-capacitive touch electrodes 320, but is not intended to limit the display device of the present disclosure. In other embodiments, each touch electrode 320 may be mutual-capacitive, which is not limited here and may be configured by those skilled in the art according to practical situations. If each touch electrode 320 is self-capacitive, the operating process of each touch electrode 320 is described as follows. Each touch electrode 320 corresponds to a certain coordinate position and produces capacitance together with the ground. When a finger touches the touch panel device, the capacitance of the finger is superimposed on a touch electrode 320 that the finger touches, thereby causing a variation in the ground capacitance of the touch electrode 320 that the finger touches. Since the signal variation of each touch electrode 320 reflects the variation of the ground capacitance of each touch electrode 320, a touch electrode 320 whose signal has undergone a variation can be determined through the detection of the signal variation of each touch electrode 320, and then the touch position of the finger can be determined on the basis of coordinates of the touch electrode 320 whose signal has undergone a variation. If each touch electrode 320 is mutual-capacitive, the operating process of each touch electrode 320 is described as follows. The mutual-capacitive touch electrode 320 includes a horizontal electrode array and a vertical electrode array. Capacitance is produced at crossing positions of the two sets of electrodes. When the finger touches the touch display panel, the coupling between two electrodes near a touch point is affected so that the capacitance between the two electrodes undergoes a variation. During the detection of the mutual capacitance, a stimulation signal is sequentially sent to each horizontal electrode, and each vertical electrode receives the signal, so that capacitance values of intersection points of horizontal electrodes and vertical electrodes, that is, capacitance values in the two-dimensional plane of the whole touch display panel, can be obtained. According to the two-dimensional capacitance variation data of the touch display panel, the coordinates of each touch point can be calculated, and then the touch position of the finger is determined.

Specifically, the non-display area NA may be configured to set a fan-out wire, an electrostatically shielded circuit, a lighting test circuit, a gate drive circuit, a touch drive chip and other electronic elements known to those skilled in the art, which is not limited in the present application.

Specifically, the touch signal may include a detection signal and a feedback signal. The detection signal is provided to each touch electrode 320 by the touch drive chip. The feedback signal that carries touch information is fed back to the touch drive chip by each touch electrode 320. Therefore, it is necessary to electrically connect each touch electrode 320 to the touch drive chip. In the present application, after each first conductive structure 20 and the respective one second conductive structure 40 are electrically connected in contact, the detection signal provided by the touch drive chip may be transmitted to each touch electrode 320 via the metal wire 50, a first conductive structure 20 and a second conductive structure 40 in sequence. The feedback signal fed back by each touch electrode 320 may be transmitted to the touch drive chip via the second conductive structure 40, the first conductive structure 20 and the metal wire 50 in sequence. There are various ways for electrically connecting the touch drive chip to the metal wire 50, which can be configured by those skilled according to actual situations and is not limited here. Exemplarily, as shown in FIG. 3, the one side of the first substrate 110 facing to the second substrate 310 is further provided with bonding gasket structures 60, and each bonding gasket structure 60 is electrically connected to the metal wire 50. Each bonding gasket structure 60 may be configured to bond the touch driver chip so that the touch driver chip can be electrically connected to the metal wire 50 through each bonding gasket structure 60. Alternatively, each bonding gasket structure 60 may be configured to bond a flexible printed circuit board on which the touch drive chip is disposed so that the touch drive chip can be electrically connected to the metal wire 50 through a wire on the flexible printed circuit board and each bonding gasket structure 60.

Specifically, to form each pixel unit 120, multiple films are generally formed on the first substrate 110 in the display area DA. Exemplarily, the first substrate 110 may be provided with an active layer, a gate insulating layer, a gate layer, an interlayer dielectric layer, a source-drain electrode layer and other films known to those skilled in the art. It is to be understood that in the display area DA, the multiple films for forming each pixel unit 120 have a certain height. In order that the first conductive structure 20 is higher than the multiple films in total in the display area DA, the first conductive structure 20 includes a first gasket structure 210 that is configured to raise the first transmit electrode 220. The first gasket structure 210 may be formed by multiple stacked films, where part of the multiple films is made of an organic material. Since the organic material has a larger fluidity and a lower hardness, if the organic film in the first gasket structure 210 has a greater height and a larger area, uneven stress is common during the film formation process, thereby causing a recess in the middle, and finally the first transmit electrode 220 is recessed in the middle, as shown in FIG. 2.

It is to be understood that in the present application, the multiple first recessed portions AX1 are formed on the first gasket structure 210 so that the first support portion ZC1 can be formed between adjacent first recessed portions AX1. Although recessed in the middle, each first support portion ZC1 is flat in the periphery, and thereby first support portions ZC1 have a flat surface large enough in total. Therefore, the first transmit electrode 220 on the first gasket structure 210 has a larger flat surface, and there is a greater effective contact area between the first transmit electrode 220 and the second conductive structure 40 when the first transmit electrode 220 is in contact with the second conductive structure 40. Such configuration can reduce the contact resistance between the first transmit electrode 220 and the second conductive structure 40, and improve the transmit rate of the first conductive structure 20 and the second conductive structure 40 for the touch signal.

In the touch display panel provided by this embodiment of the present disclosure, the multiple first recessed portions AX1 are disposed on the first gasket structure 210 of the first conductive structure 20 so that the first support portion ZC1 is formed between the adjacent two first recessed portions AX1. Although recessed in the middle, each first support portion ZC1 is flat in the periphery, and thereby first support portions ZC1 have a flat surface large enough in total. Compared to the related art, such configuration can improve the situation that the first transmit electrode 220 on the first gasket structure 210 is recessed in the middle and enlarge the flat surface of the first transmit electrode 220, thereby increasing the effective contact area between the first transmit electrode 220 and the second conductive structure 40, reducing the contact resistance between the first transmit electrode 220 and the second conductive structure 40, and improving the transmit rate of the first conductive structure 20 and the second conductive structure 40 for the touch signal.

Figure 5:
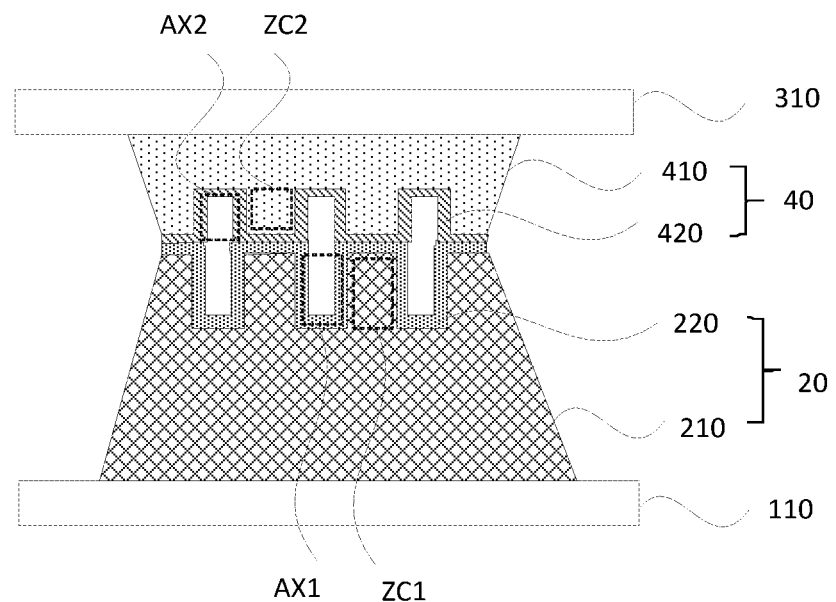
FIG. 5 is another cross sectional view taken along a section line B-B' of FIG. 3.

FIG. 5 is another cross sectional view taken along a section line B-B' of FIG. 3. Referring to FIG. 5, optionally, each second conductive structure 40 includes a second transmit electrode 420 and a second gasket structure 410 that is disposed between the second transmit electrode 420 and the second substrate 310. The second transmit electrode 420 is electrically connected to the touch electrode 320 and the first transmit electrode 220. The second gasket structure 410 includes multiple second recessed portions AX2. A second support portion AC2 is disposed between adjacent second recessed portions AX2.

Specifically, in the display area DA, the multiple touch electrodes 320 and a film for protecting each touch electrode 320 may be formed on the second substrate 310. In order that the first conductive structure 40 is higher than stacked films in total in the display area DA, the second conductive structure 40 includes the second gasket structure 410 that is configured to raise the second transmit electrode 420. The second gasket structure 410 may be formed by multiple stacked films, where the second gasket structure 410 may include or not include an organic film.

It is to be understood that if the second gasket structure 410 includes the organic film, the second gasket structure 410 also is recessed in the middle, and this is similar to the multiple first recessed portions AX1 on the first gasket structure 210. In the present application, the multiple second recessed portions AX2 are formed on the second gasket structure 210 so that the second support portion ZC2 is formed between the adjacent second recessed portions AX2. In this way, second support portions ZC2 can have a flat surface large enough in total so that the second transmit electrode 420 on the second gasket structure 410 has a larger flat surface, and there is a greater effective contact area between the first transmit electrode 200 and the second transmit electrode 420 when the first transmit electrode 200 is disposed contact with the second transmit electrode 420. Accordingly, such configuration further reduces the contact resistance between the first transmit electrode 220 and the second transmit electrode 420 and improves the transmit rate of the first conductive structure 20 and the second conductive structure 40 for the touch signal.

It is to be noted that the number of first support portions ZC1, the number of first recessed portions AX1, and orthographic projection areas of the first support portions ZC1 and the multiple first recess AX1 onto the first substrate may be configured by those skilled in the art according to practical situations, which is not limited in the present application. Similarly, the number of second support portions ZC2, the number of second recessed portions AX2, and orthographic projection areas of the second support portions ZC2 and the multiple second recessed portions AX2 onto the first substrate may be configured by those skilled in the art according to practical situations.

On the basis of the preceding technical solution, specifically, when the first substrate 110 is disposed opposite to the second substrate 310 so that each first conductive structure 20 and the respective second conductive structure 40 are electrically connected in contact, the orthographic projection of the first support portion ZC1 onto the first substrate 110 may be at least partially overlapped with the orthographic projection of the second support portion ZC2 onto the first substrate 110, or may be not overlapped with the orthographic projection of the second support portion ZC2 onto the first substrate 110 at all. Each case will be separately described below.

Firstly, optionally, the orthographic projection of the first support portion ZC1 onto the first substrate 110 is at least partially overlapped with the orthographic projection of the second support portion ZC2 onto the first substrate 110. In this way, the part of the first transmit electrode 220 on the first support portion ZC1 and the part of the second transmit electrode 420 on the second support portion ZC2 can be electrically connected in contact.

Figure 6:
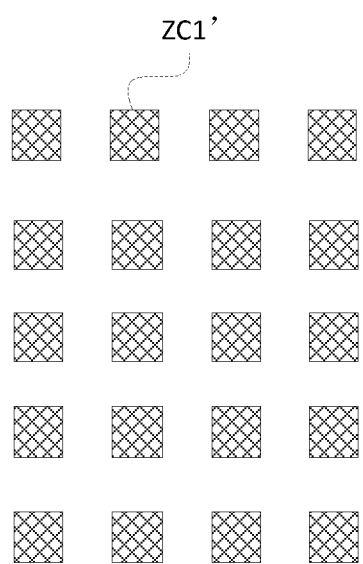
FIG. 6 is a structural diagram of orthographic projections of the first support portions onto the first substrate according to an embodiment of the present disclosure.
Figure 7:
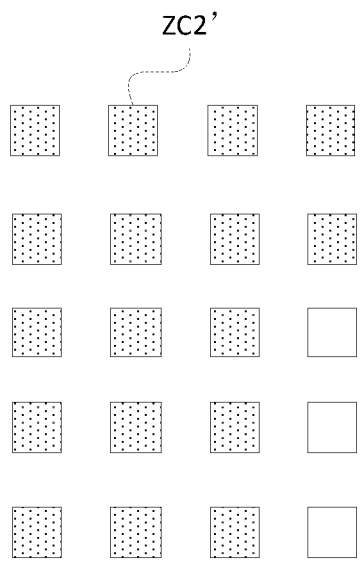
FIG. 7 is a structural diagram of orthographic projections of the second support portions onto the first substrate according to an embodiment of the present disclosure.
Figure 8:
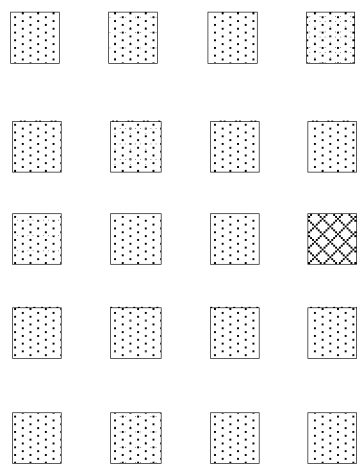
FIG. 8 is a positional relationship diagram of orthographic projections of the first support portions and the second support portions onto the first substrate according to an embodiment of the present disclosure.

FIG. 6 is a structural diagram of orthographic projections of first support portions onto a first substrate 110 according to an embodiment of the present disclosure. FIG. 7 is a structural diagram of orthographic projections of first support portions onto a first substrate 110 according to an embodiment of the present disclosure. FIG. 8 is a position relationship diagram of orthographic projections of first support portions and second support portions onto a first substrate 110 according to an embodiment of the present disclosure. Referring to FIGS. 6 to 8, optionally, the orthographic projection ZC1' of the first support portion ZC1 onto the first substrate 110 is completely overlapped with the orthographic projection ZC2' of the second support portion ZC2 onto the first substrate 110. Through such configuration, the part of the first transmit electrode 220 on each first support portion ZC1 and the second transmit electrode 420 have the opportunity to be electrically connected in contact, and this helps increase the effective contact area between the first transmit electrode 220 and the second transmit electrode 420. Additionally, during the manufacturing process of the first support portion ZC1 and the second support portion ZC2, it is feasible to use the same mask plate, thereby saving the number of mask plates for the manufacturing process of the touch display panel and reducing manufacturing costs.

Figure 9:
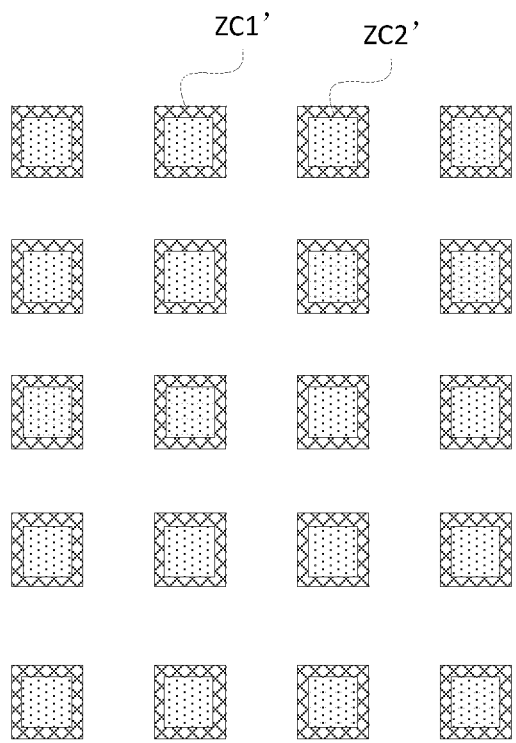
FIG. 9 is another positional relationship diagram of orthographic projections of the first support portions and the second support portions onto the first substrate according to an embodiment of the present disclosure.

FIG. 9 is another position relationship diagram of orthographic projections of first support portions ZC1 and second support portions ZC2 onto a first substrate 110 according to an embodiment of the present disclosure. Referring to FIG. 9, optionally, the first support portions ZC1 are not connected to each other, the second support portions ZC2 are not connected to each other, each first support portion ZC1 corresponds to a respective second support portion ZC2, and the orthographic projection ZC1' of the first support portion ZC1 onto the first substrate 110 is partially overlapped with the orthographic projection ZC2' of the second support portion ZC2 onto the first substrate 110. Such configuration helps those skilled in the art flexibly configure the first support portion ZC1 and the second support portion ZC2 according to practical situations.

Figure 10:
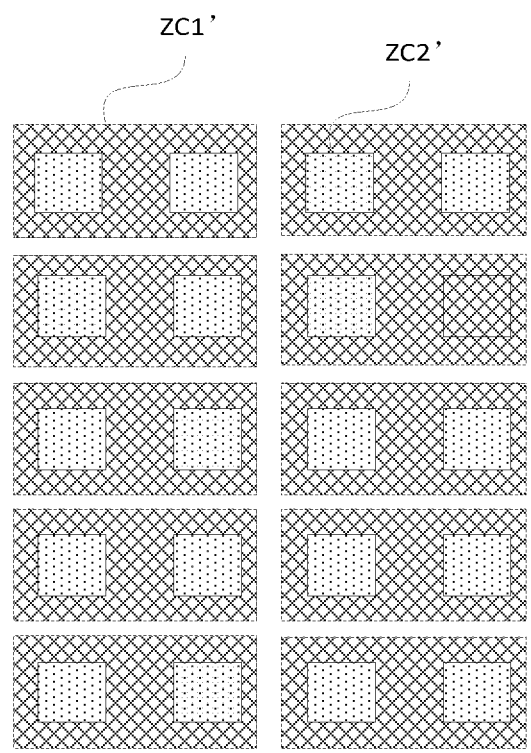
FIG. 10 is another positional relationship diagram of orthographic projections of the first support portions and the second support portions onto the a first substrate according to an embodiment of the present disclosure.

FIG. 10 is another position relationship diagram of orthographic projections of first support portions ZC1 and second support portions ZC2 onto a first substrate 110 according to an embodiment of the present disclosure. referring to FIGS. 9 and 10, optionally, the orthographic projection ZC1' of the first support portion ZC1 onto the first substrate 110 is within the orthographic projection ZC2' of the second support portion ZC2 onto the first substrate 110. Alternatively, the orthographic projection ZC2' of the second support portion ZC2 onto the first substrate 110 is within the orthographic projection ZC1' of the first support portion ZC1 onto the first substrate 110.

It is to be noted that the description that the orthographic projection ZC1' of the first support portion ZC1 onto the first substrate 110 is within the orthographic projection ZC2' of the second support portion ZC2 onto the first substrate 110 here refers to the relationship between the orthographic projection of the first support portion ZC1 and the orthographic projection of the second support portion ZC2 onto the first substrate 110 when the first support portion ZC1 is aligned with the second support portion ZC2 without deviation according to the theoretical design. This is similar to the description that the orthographic projection ZC2' of the second support portion ZC2 onto the first substrate 110 is within the orthographic projection ZC1' of the first support portion ZC1 onto the first substrate 110, which is not repeated here.

It is to be understood that after each film on the first substrate 110 and the second substrate 310 is separately manufactured, during the process of disposing the first substrate 110 and the second substrate 310 opposite to each other in combination to form a touch display panel, the first substrate 110 may be misaligned with and the second substrate 310. When the first substrate 110 is misaligned with the second substrate 310, each first conductive structure 20 is misaligned with the respective second conductive structure 40, and thereby, the alignment area between the first support portion ZC1 and the second support portion ZC2 may be reduced. In theory, the orthographic projection ZC1' of the first support portion ZC1 onto the first substrate 110 is within the orthographic projection ZC2' of the second support portion ZC2 onto the first substrate 110 to reduce the probability that a part of the first support portion ZC1 is aligned with a second recess AX2 when the first substrate 110 is misaligned with the second substrate 310. In other words, such configuration can improve the probability that the practical aligned area between the first support portion ZC1 and the second support portion ZC2 is equal to the theoretical aligned area. This can increase the probability that the part of the first transmit electrode 220 on each first support portion ZC1 is disposed contact with the second transmit electrode 420, and ensure an effective contact area large enough between the first transmit electrode 220 and the second transmit electrode 420. Similarly, the same effect can be achieved if the orthographic projection ZC2' of the second support portion ZC2 onto the first substrate 110 is configured within the orthographic projection ZC1' of the first support portion ZC1 onto the first substrate 110, which is not repeated here.

Figure 11:
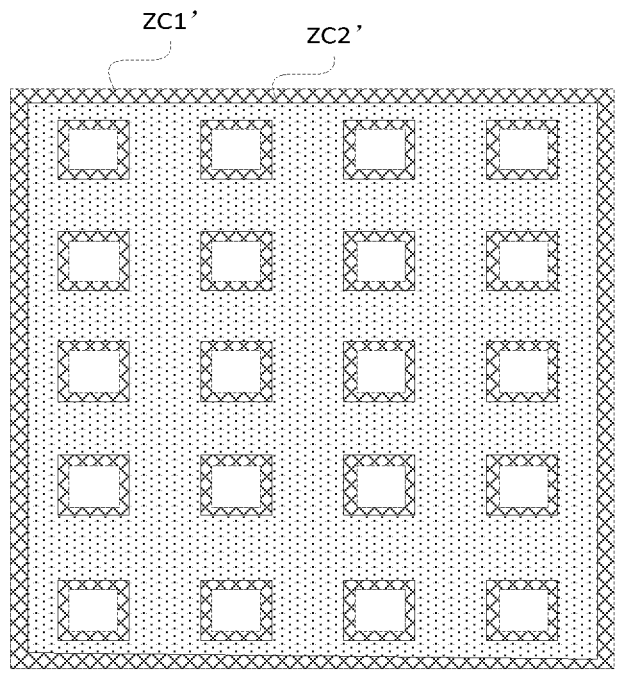
FIG. 11 is another positional relationship diagram of orthographic projections of the first support portions and the second support portions onto the first substrate according to an embodiment of the present disclosure.

FIG. 11 is another position relationship diagram of orthographic projections of first support portions and second support portions onto a first substrate according to an embodiment of the present disclosure. Referring to FIGS. 9 and 11, optionally, the orthographic projection ZC1' of a center point of the first support portion ZC1 onto the first substrate 110 is coincident with the orthographic projection ZC2' of a center point of the second support portion ZC2 onto the first substrate 110.

It is to be noted that the description that the orthographic projection ZC1' of the center point of the first support portion ZC1 onto the first substrate 110 is coincident with the orthographic projection ZC2' of the center point of the second support portion ZC2 onto the first substrate 110 here refers to the relationship between the orthographic projection of the first support portion ZC1 and the orthographic projection of the second support portion ZC2 onto the first substrate 110 when the first support portion ZC1 is aligned with the second support portion ZC2 without deviation according to the theoretical design.

Such configuration can reduce the risk that the part of the first support portion ZC1 is aligned with the second recess portions AX2 when the first substrate 110 is misaligned with the second substrate 310, thereby improving the probability that the practical aligned area between the first support portion ZC1 and the second support portion ZC2 is equal to the theoretical aligned area, and ensuring an effective contact area large enough between the first transmit electrode 220 and the second transmit electrode 420.

Next, optionally, the orthographic projection of the first support portion ZC1 onto the first substrate 110 is at least partially overlapped with the orthographic projection of the second recessed portion AX2 onto the first substrate 110. That is, the orthographic projection of the first support portion ZC1 onto the first substrate 110 is not overlapped with the orthographic projection of the second support portion ZC2 onto the first substrate 110 at all. In this way, when the first support portion ZC1 is higher than the second support portion ZC2, the part of the first transmit electrode 220 on the first support portion ZC1 and the part of the second transmit electrode on the second recessed portion AX2 may be electrically connected in contact; and when the first support portion ZC1 is lower than the second support portion ZC2, the part of the first transmit electrode 220 on a first recess AX1 and the part of the second transmit electrode on the second support portion ZC2 may be electrically connected in contact.

Figure 12:
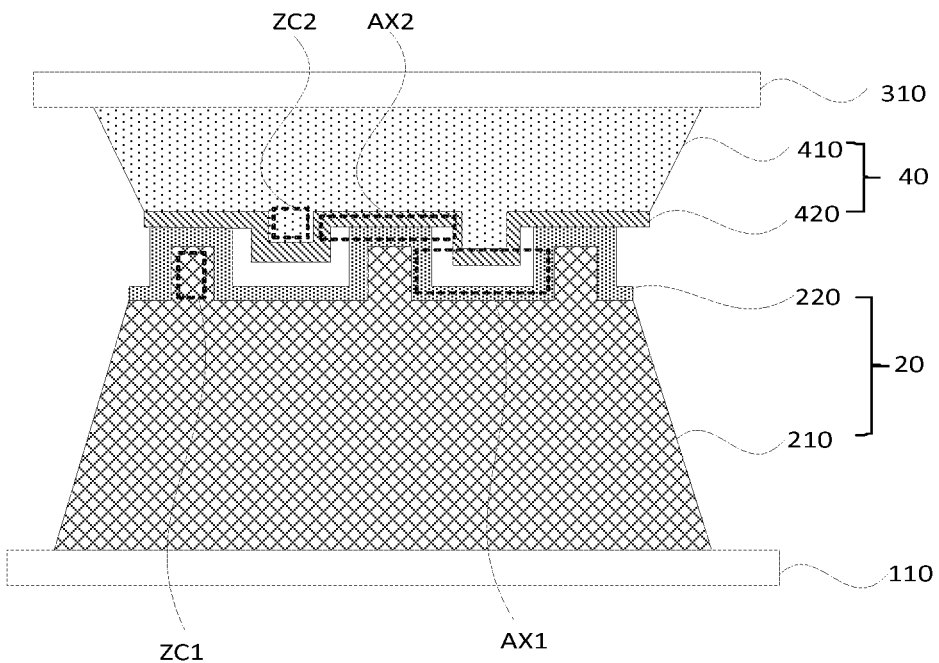
FIG. 12 is another cross sectional view taken along a section line B-B' of FIG. 3.

FIG. 12 is another cross sectional view taken along a section line B-B' of FIG. 3. Referring to FIG. 12, optionally, the orthographic projection of the first support portion ZC1 onto the first substrate 110 is at least partially overlapped with the orthographic projection of the second recessed portion AX2 onto the first substrate 110. Through such configuration, those skilled in the art can flexibly configure the first support portion ZC1 and the second recessed portion AX2 according to practical situations. Additionally, when the first substrate 110 is misaligned with the second substrate 310 (where the alignment deviation is within the allowable range), the fitting between each first conductive structure 20 and the respective one second conductive structure 40 is not affected.

Figure 13:
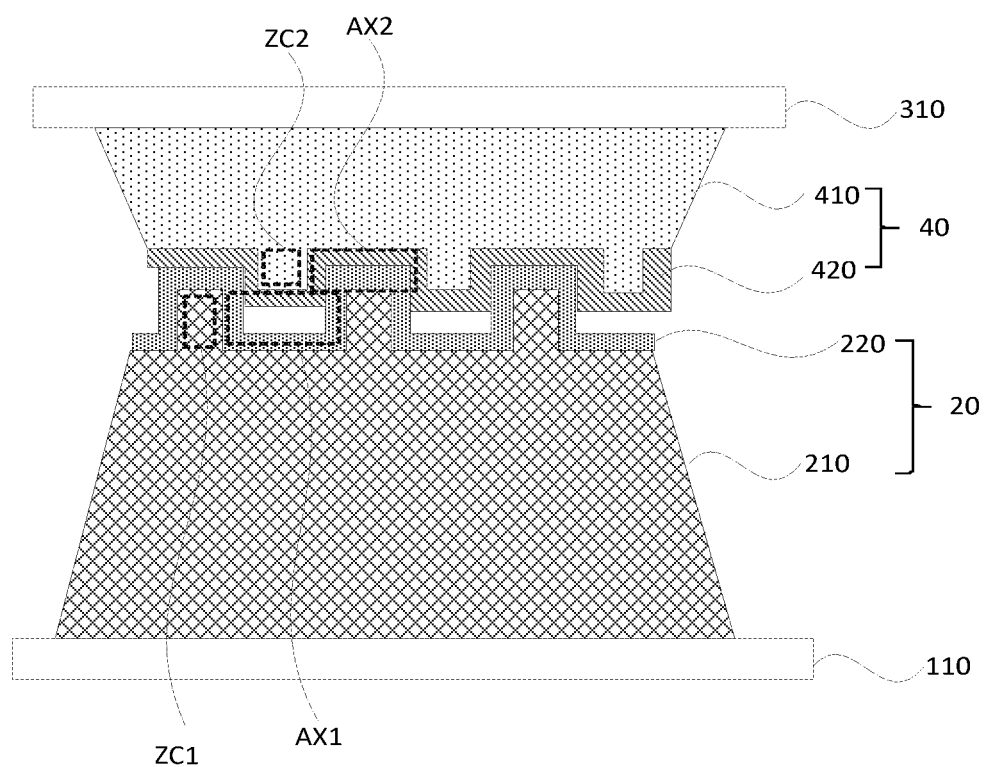
FIG. 13 is another cross sectional view taken along a section line B-B' of FIG. 3.

FIG. 13 is another cross sectional view taken along a section line B-B' of FIG. 3. Referring to FIG. 13, optionally, the orthographic projection of the first support portion ZC1 onto the first substrate 110 is completely overlapped with the orthographic projection of the second recessed portion AX2 onto the first substrate 110. Through such configuration, the part of the first transmit electrode 220 on the sidewall of the first support portion ZC1 and the part of the second transmit electrode 420 on the sidewall of the second recessed portion AX2 can be electrically connected in contact, and this helps increase the effective contact area between the first transmit electrode 220 and the second transmit electrode 420.

Figure 14:
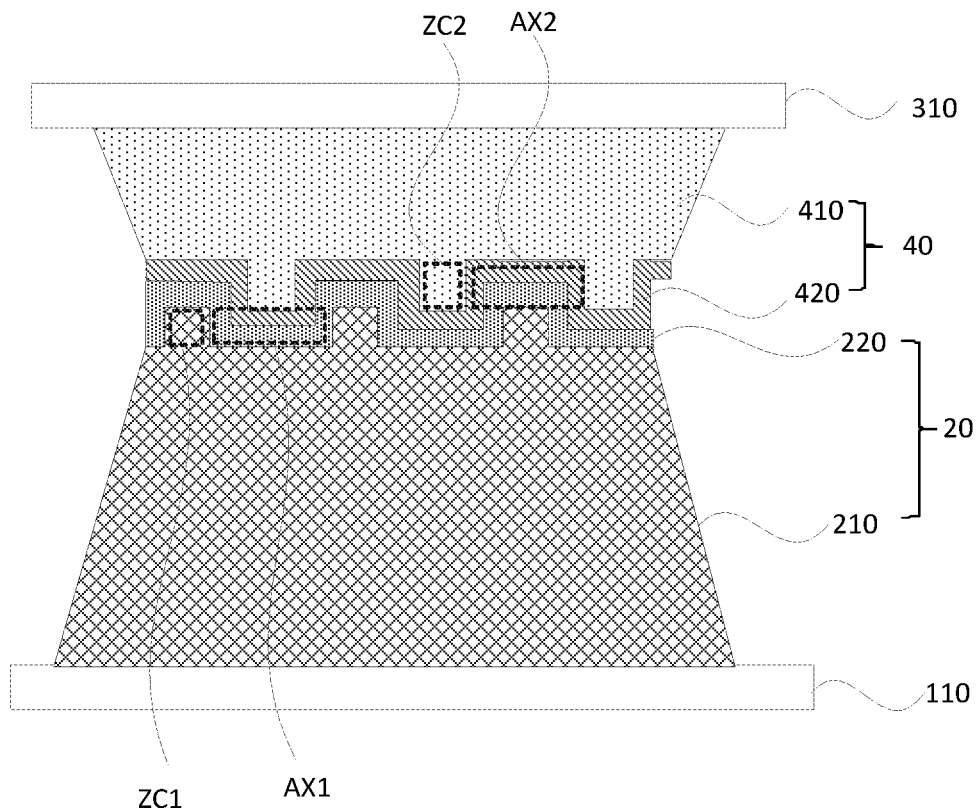
FIG. 14 is a cross sectional view taken along a section line B-B' of FIG. 3.

FIG. 14 is a cross sectional view taken along a section line B-B' of FIG. 3. Referring to FIG. 14, optionally, the first support portion ZC1 has the same height as the second support portion ZC2 along the thickness direction of the display panel. Through such configuration, the part of the first transmit electrode 220 on the first support portion ZC1 and the part of the second transmit electrode on the second recessed portion AX2 can be electrically connected in contact, and at the same time, the part of the first transmit electrode 220 on the first recessed portion AX1 and the part of the second transmit electrode on the second support portion ZC2 can be electrically connected in contact. This further increases the effective contact area between the first transmit electrode 220 and the second transmit electrode 420.

On the basis of the preceding technical solution, Still referring to FIGS. 6 to 10, optionally, the orthographic projection of the first support portion ZC1 onto the first substrate 110 includes at least one of: a rectangular, circular, oval or ring-shaped, and the orthographic projection of the second support portion ZC2 onto the first substrate 110 includes at least one of a rectangular shape, a circular shape, an oval shape or a ring shape.

Specifically, those skilled in the art may configure shapes of orthographic projection of the first support portion ZC1 and the second support portion ZC2 onto the first substrate 110 according to practical situations. Orthographic projections of the first support portions ZC1 on the first gasket structure 210 onto the first substrate 110 may have identical or non-identical shapes. Similarly, orthographic projections of the second support portions ZC2 on the second gasket structure 410 onto the first substrate 110 may have identical or non-identical shapes. Orthographic projections of the first support portions ZC1 and the second support portions ZC2 onto the first substrate 110 may have identical or non-identical shapes. Additionally, each first support portion ZC1 on the first gasket structure 210 may correspond to a respective second support portion ZC2 on the second gasket structure 410, as shown in FIGS. 8 and 9. The number of first support portions ZC1 on the first gasket structure 210 may be different from the number of second support portions ZC2 on the second gasket structure 410, as shown in FIG. 10.

It is to be understood that each first support portion ZC1 is disposed independently and has a smaller area, and such configuration alleviates the occurrence of uneven stress during film formation and the recess problem in the middle, enlarges the part of the first support portion ZC1 with a flat surface, and finally increases the effective contact area between the first transmit electrode 220 and the second transmit electrode 420. The second support ZC2 is similar to the first support ZC1, which is not be repeated here.

Still referring to FIG. 11, optionally, the first support portions ZC1 are integrally connected and the second support portions ZC2 are integrally connected.

Specifically, multiple first recessed portions AX1 surround the first support portion ZC1, and such configuration helps release of the stress during film formation, and further alleviates the recess problem in the middle caused by uneven stress, enlarges the part of the first support portion ZC1 with a flat surface, and finally increases the effective contact area between the first transmit electrode 220 and the second transmit electrode 420. The second support ZC2 is similar to the first support ZC1, which is not be repeated here.

Still referring to FIG. 11, optionally, the first support portions ZC1 are connected to form a mesh and the second support portions ZC2 are connected to form a mesh.

It is to be noted that FIG. 11 just shows the example in which the first recessed portion AX1 and the second recessed portion AX2 on the first substrate 110 have rectangular orthographic projections, but is not intended to limit the present application. For example, each orthographic projection may be at least one of a circle, an oval parallelogram, a regular pentagon, or other shapes known to those skilled in the art. Similarly, orthographic projections of the multiple first recessed portions AX1 on the first gasket structure 210 onto the first substrate 110 may have identical or non-identical shapes. Similarly, orthographic projections of the multiple second recessed portions AX2 on the second gasket structure 410 onto the first substrate 110 may have identical or non-identical shapes. Orthographic projections of the first recessed portion AX1 and the second recessed portion AX2 onto the first substrate 110 may have identical or non-identical shapes. Here, each first recessed portion AX1 on the first gasket structure 210 may correspond to a respective one second recessed portion AX2 on the second gasket structure 410, as shown in FIG. 11. The number of first recessed portions AX1 on the first gasket structure 210 may be different from the number of second recessed portions AX2 on the second gasket structure 410.

On the basis of the preceding technical solution, specifically, there are various ways for electrically connecting the first conductive structure 20 to the metal wire 50, and similarly, there are various ways for electrically connecting the second conductive structure 40 to the touch electrode 320, which can be configured by those skilled in the art according to practical situations. A typical example is described below.

Figure 15:
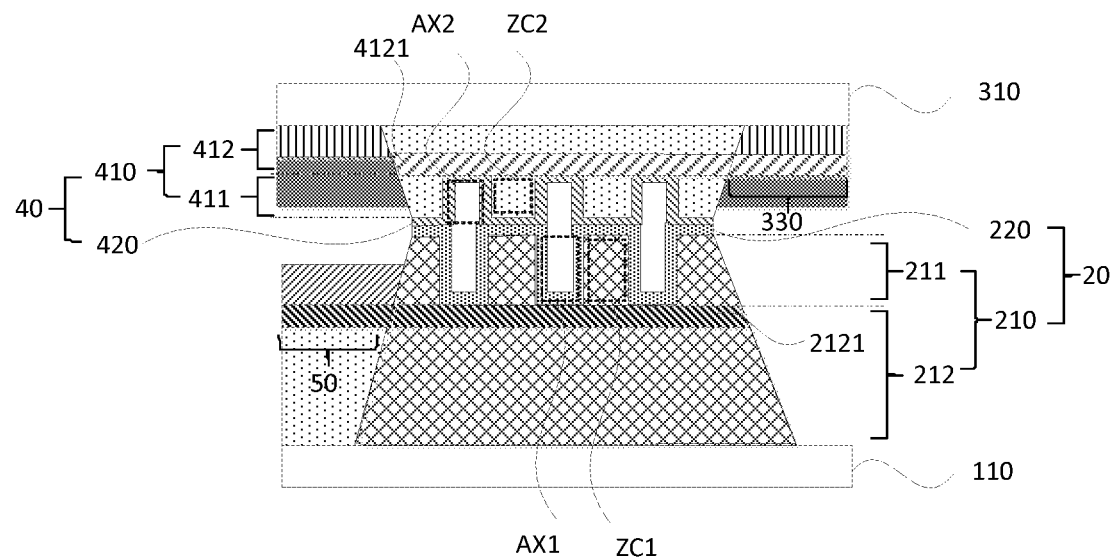
FIG. 15 is a cross sectional view taken along a section line C-C' of FIG. 3.

FIG. 15 is a cross sectional view taken along a section line C-C' of FIG. 3. Optionally, the first gasket structure 210 includes a first sub-gasket structure 211 and a second sub-gasket structure 212. The first sub-gasket structure 211 is on one side of the second sub-gasket structure 212 facing away from the first substrate 110. The second sub-gasket structure 212 includes a third transmit electrode 2121 that is electrically connected to the metal wire 50. The first recessed portion AX1 penetrates the first sub-gasket structure 211 along a direction vertical to a plane in which the first substrate is located 110, so that the exposed third transmit electrode 2121 is exposed. The second gasket structure 410 includes a third sub-gasket structure 411 and a fourth sub-gasket structure 412. The third sub-gasket structure 411 is on one side of the fourth sub-gasket structure 412 facing away from the second substrate 310. The fourth sub-gasket structure 412 includes a fourth transmit electrode 4121 that is electrically connected to the touch electrode 320. The second recessed portion AX2 penetrates the third sub-gasket structure 411 along the direction vertical to the plane in which the first substrate is located 110, so that the fourth transmit electrode 4121 is exposed.

Specifically, the third transmit electrode 2121 may be in the same layer as the metal wire 50, as shown in FIG. 15. The third transmit electrode 2121 and the metal wire 50 may be in different layers and electrically connected through a via hole. Specifically, the fourth transmit electrode 4121 is electrically connected to the touch electrode 320 through a touch wire 330. The fourth transmit electrode 4121 may be in the same layer as the touch wire 330, as shown in FIG. 15. The fourth transmit electrode 4121 and the touch wire 330 may be in different layers and electrically connected through a via hole.

Through such configuration, the part of the first transmit electrode 220 on the first recessed portion AX1 and the third transmit electrode 2121 may be electrically connected in contact. This can increase the effective contact area between the first transmit electrode 220 and the third transmit electrode 2121, reduce the contact resistance between the first transmit electrode 220 and the third transmit electrode 2121 and improve the transmit rate for the touch signal. The second transmit electrode 420 and the fourth transmit electrode 4121 are similar to the first transmit electrode 220 and the third transmit electrode 2121, respectively, which are not repeated here.

It is to be noted that those skilled in the art can configure, according to practical situations, a specific film between the touch wire 330 and the second substrate 310, a specific film on one side of the touch wire 330 facing away from the second substrate 220, a specific film between the metal wire 50 and the first substrate 110, and a specific film on one side of the metal wire 50 facing away from the first substrate 110 in FIG. 15, which is not limited here. Exemplarily, a film in the same layer as a black matrix, a film in the same layer as a color resist layer, and a film in the same layer as a flat layer are between the touch wire 330 and the second substrate 310; a film in the same layer as a first insulating layer is the on one side of the touch wire 330 facing away from the second substrate 220; a film in the same layer as the gate insulating layer, a film in the same layer as an interlayer insulating layer, and a film in the same layer as the interlayer dielectric layer are between the metal wire 50 and the first substrate 110; and a film in the same layer as a passivation layer, and a film in the same layer as a planarization layer are on the one side of the metal wire 50 facing away from the first substrate 110.

Figure 16:
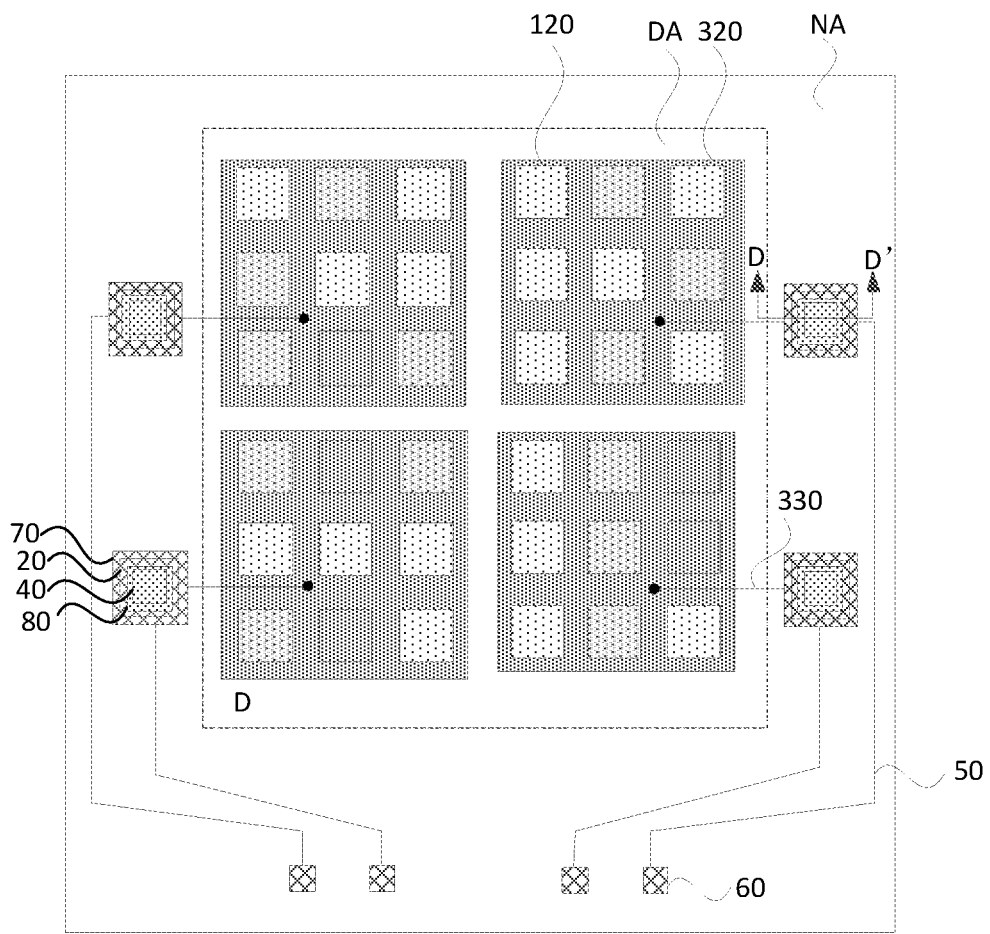
FIG. 16 is a structural diagram of another touch display panel according to an embodiment of the present disclosure.
Figure 17:
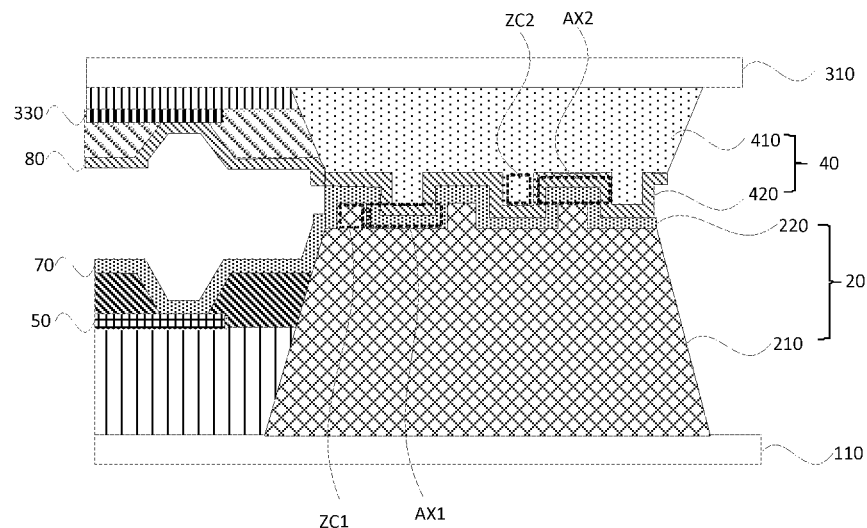
FIG. 17 is a cross sectional view along the line DD' of FIG. 16.

FIG. 16 is a structural diagram of another touch display panel according to an embodiment of the present disclosure. FIG. 17 is a cross sectional view along direction DD' of FIG. 16. Referring to FIGS. 16 and 17, optionally, in the non-display area NA, the one side of the first substrate 110 facing to the second substrate 310 is further provided with a first connection structure 70. The first connection structure 70 and the first transmit electrode 220 are in the same layer and electrically connected. The vertical distance between a plane in which the first connection structure is located 70 and a plane of the metal wire 50 is less than the distance between a plane of the first transmit electrode 220 and the plane of the metal wire 50. The orthographic projection of the metal wire 50 onto the first substrate 110 is within the orthographic projection of the first connection structure 70 onto the first substrate 110. The first connection structure 70 is electrically connected to the metal wire 50 through a via hole. In the non-display area NA, the one side of the second substrate 310 facing to the first substrate 110 is further provided with the touch wire 330 and a second connection structure 80. The touch wire 330 is electrically connected to the touch electrode 320. The second connection structure 80 and the second transmit electrode 420 are in the same layer and electrically connected. The vertical distance between a plane in which the second connection structure is located 80 and a plane in which the touch wires are located 330 is less than the distance between a plane in which the second transmit electrode is located 420 and the plane in which the touch wires are located 330. The orthographic projection of the touch wire 330 onto the second substrate 310 is within the orthographic projection of the second connection structure 80 onto the second substrate 310. The second connection structure 80 is electrically connected to the touch wire 330 through a via hole.

It is to be understood that if the metal wire 50 is electrically connected to the first transmit electrode 220 through the via, the via has a greater depth when the vertical distance between the metal wire 50 and the first transmit electrode 220 is too great, and thus, during the manufacturing of the first transmit electrode 220, the first transmit electrode 220 may be broken in the via due to process limitations when filling the via. In the present application, it is not necessary to electrically connect the first connection structure 70 to the second conductive structure 40, so it is not necessary to raise the first connection structure 70 to the same height as the first conductive electrode 220. That is, those skilled in the art can flexibly configure the vertical distance between the metal wire 50 and the first connection structure 70, thereby ensuring that the first connection structure 70 can be electrically connected to the metal wire 50 through the via and the first transmit electrode 220 is electrically connected to a metal electrode effectively. The second connection structure 80 has the same function as the first connection structure 70, which is not repeated here.

It is to be noted that those skilled in the art can configure, according to practical situations, a specific film between the metal wire 50 and the first connection structure 70, a specific film between the metal wire 50 and the first substrate 110, a specific film between the touch wire 330 and the second connection structure 80, and a specific film between the touch wire 330 and the second substrate 310 in FIG. 17, which is not limited here. Exemplarily, the film in the same layer as the passivation layer, and the film in the same layer as the planarization layer are between the metal wire 50 and the first connection structure 70; the film in the same layer as the gate insulating layer, the film in the same layer as the interlayer insulating layer, and the film in the same layer as the interlayer dielectric layer are between the metal wire 50 and the first substrate 110; the first insulating layer is disposed between the touch wire 330 and the second connection structure 80; the film in the same layer as the black matrix, the film in the same layer as the color resist layer, and the film in the same layer as the flat layer are between the touch wire 330 and the second substrate 310.

On the basis of the preceding technical solutions, specifically, the touch display panel may be an organic light-emitting diode display panel, a liquid crystal display panel, or another display panel known to those skilled in the art. Examples of the organic light-emitting diode display panel and the liquid crystal display panel are separately described below.

First, the touch display panel may be the organic light-emitting diode display panel.

Figure 18:
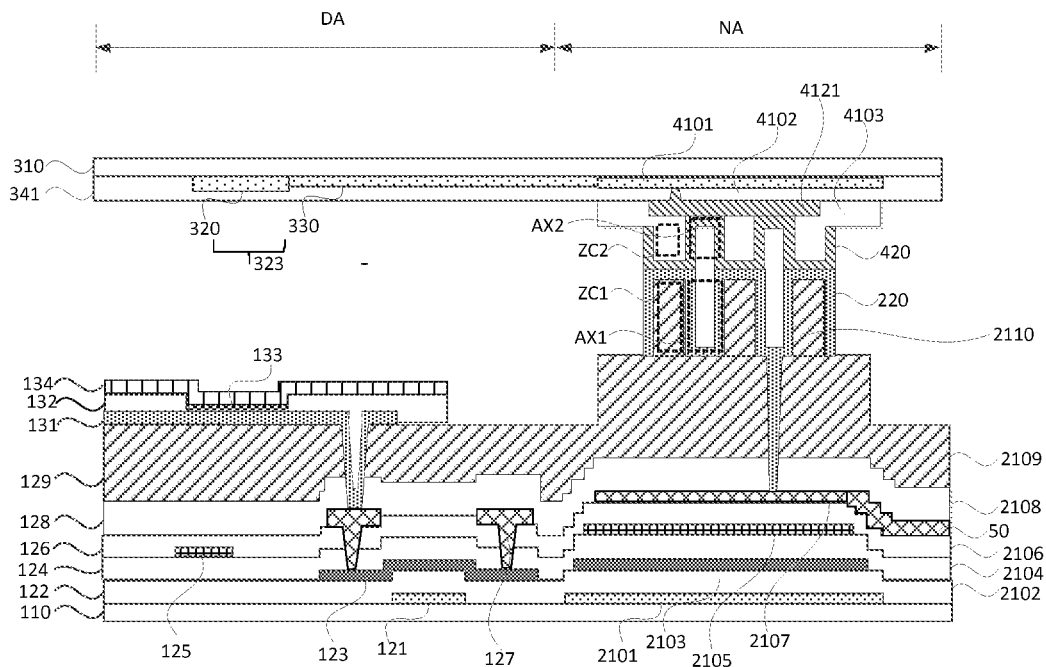
FIG. 18 is a structural diagram of another touch display panel according to an embodiment of the present disclosure.

FIG. 18 is a structural diagram of another touch display panel according to an embodiment of the present disclosure. Referring to FIG. 18, optionally, in the display area DA, the first substrate 110 is further sequentially provided with the active layer 121, the gate insulating layer 122, a gate metal layer 123, the interlayer insulating layer 124, a capacitance metal layer 125, the interlayer dielectric layer 126, the source-drain metal layer 127, the passivation layer 128, the planarization layer 129 and an anode metal layer 131. The active layer 121 is disposed the same layer as the first film 1201 of the first gasket structure 210. The gate insulating layer 122 is disposed the same layer as the second film 1202 of the first gasket structure 210. The gate metal layer 123 is disposed the same layer as the third film 1203 of the first gasket structure 210. The interlayer insulating layer 124 is disposed the same layer as the fourth film 1204 of the first gasket structure 210. The capacitance metal layer 125 is disposed the same layer as the fifth film 1205 of the first gasket structure 210. The interlayer dielectric layer 126 is disposed the same layer as the sixth film 1206 of the first gasket structure 210. The source-drain metal layer 127 is disposed the same layer as the seventh film 1207 of the first gasket structure 210. The passivation layer 128 is disposed the same layer as the eighth film 1208 of the first gasket structure 210. The planarization layer 129 is disposed the same layer as the ninth film 129 of the first gasket structure 210. The anode metal layer 131 is disposed the same layer as the first transmit electrode 220. The tenth film 1210 of the first gasket structure 210 is disposed between the first transmit electrode 220 and the ninth film 1209 of the first gasket structure 210.

It is to be understood that some films in the display area DA are disposed in the same layers as some films in the first conductive structure 20 so that the process steps can be reduced and the manufacturing efficiency of the touch display panel can be improved.

It is to be noted that in the display area DA, in addition to the preceding films, other films known to those skilled in the art may be disposed on the first substrate 110, which is not limited in the present application. Exemplarily, as shown in FIG. 18, in the display area DA, one side of the anode metal layer facing away from the first substrate 110 is further sequentially provided with a pixel defining layer 132, a light-emitting layer 133 and a cathode metal layer 134.

Still referring to FIG. 18, optionally, in the display area DA, a touch electrode layer 323 and a protection layer 341 are further sequentially configured on the second substrate 310. The touch electrode layer 323 is disposed the same layer as the first film 4101 of the second gasket structure 410. The protection layer 341 is disposed the same layer as the second film 4102 of the second gasket structure 410. The third film 4103 of the second gasket structure 410 is disposed between the second film 4102 of the second gasket structure 410 and the second transmit electrode 420.

Specifically, the touch electrode layer 323 may be made of a transparent conductive material or an opaque metal material, which is not limited in the present application. Exemplarily, the touch electrode 320 may be made of indium tin oxide (ITO) or other conductive materials known to those skilled in the art.

It is to be understood that some films in the display area DA are disposed in the same layers as some films in the second conductive structure 40 so that the process steps can be reduced and the manufacturing efficiency of the touch display panel can be improved.

Next, the touch display panel may be the liquid crystal display panel.

Figure 19:
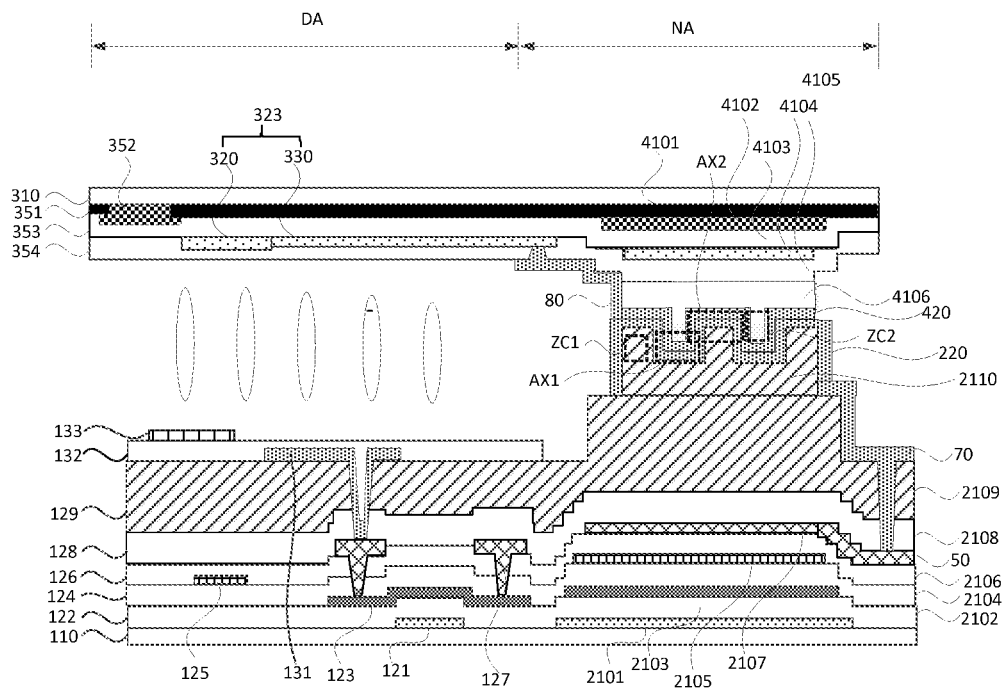
FIG. 19 is a structural diagram of another touch display panel according to an embodiment of the present disclosure.

FIG. 19 is a structural diagram of another touch display panel according to an embodiment of the present disclosure. Optionally, in the display area DA, the second substrate 310 is further sequentially provided with the black matrix 351, the color resist layer 352, the flat layer 353, the touch electrode layer 323 and the first insulating layer 354. The black matrix 351 is disposed the same layer as the first film 4101 of the second gasket structure 410. The color resist layer 352 is disposed the same layer as the second film 4102 of the second gasket structure 410. The flat layer 353 is disposed the same layer as the third film 4103 of the second gasket structure 410. The touch electrode layer 323 is disposed the same layer as the fourth film 4104 of the second gasket structure 410. The first insulating layer 354 is disposed the same layer as the fifth film layer 4105 of the second gasket structure 410. The sixth film 4106 of the second gasket structure 410 is disposed between the fifth film 4105 of the second gasket structure 410 and a second conductive layer.

Still referring to FIG. 19, optionally, in the display region DA, the first substrate 110 is further provided with the active layer 121, the gate insulating layer 122, the gate metal layer 123, the interlayer insulating layer 124, the capacitance metal layer 125, the interlayer dielectric layer 126, the source-drain metal layer 127, the passivation layer 128, the planarization layer 129, a pixel electrode layer 131, a second insulating layer 132 and a common electrode layer 133 sequentially. The active layer 121 is disposed the same layer as the first film 1201 of the first gasket structure 210. The gate insulating layer 122 is disposed the same layer as the second film 1202 of the first gasket structure 210. The gate metal layer 123 is disposed the same layer as the third film 1203 of the first gasket structure 210. The interlayer insulating layer 124 is disposed the same layer as the fourth film 1204 of the first gasket structure 210. The capacitance metal layer 125 is disposed the same layer as the fifth film 1205 of the first gasket structure 210. The interlayer dielectric layer 126 is disposed the same layer as the sixth film 1206 of the first gasket structure 210. The source-drain metal layer 127 is disposed the same layer as the seventh film 1207 of the first gasket structure 210. The passivation layer 128 is disposed the same layer as the eighth film 1208 of the first gasket structure 210. The planarization layer 129 is disposed the same layer as the ninth film 1209 of the first gasket structure 210. The pixel electrode layer 131 is disposed the same layer as the first transmit electrode 220. The tenth film 1210 of the first gasket structure 210 is disposed between the first transmit electrode 220 and the ninth film 1209 of the first gasket structure 210.

It is to be understood that some films in the display area DA are disposed in the same layer as some films in the first conductive structure 20 so that the process steps can be reduced and the manufacturing efficiency of the touch display panel can be improved.

It is to be noted that in the display area DA, in addition to the preceding films, other films known to those skilled in the art may be disposed on the first substrate 310, which is not limited in the present application. Additionally, FIG. 19 just shows the example in which the common electrode layer 131 is disposed on the first substrate 110, but is not intended to limit the present disclosure. For example, the common electrode layer 131 may be disposed on the second substrate 310, or the touch electrode layer 323 may be reused as the common electrode layer 131.

Still referring to FIGS. 18 and 19, optionally, the first recessed portion AX1 penetrates the ninth film 2109 and the tenth film layer 2110 of the first gasket structure 210. Alternatively, the first recessed portion AX1 penetrates the tenth film 2110 of the first gasket structure 210, as shown in FIG. 18. Alternatively, the first recessed portion AX1 partially penetrates the tenth film 2110 of the first gasket structure 210, as shown in FIG. 19.

It is to be understood that those skilled in the art may configure, according to practical situations, the film penetrated by the first recessed portion AX1, and further flexibly adjust the height of the first support portion ZC1 so that each first conductive structure 20 and the respective second conductive structure 40 can be electrically connected in contact.

Still referring to FIGS. 18 and 19, optionally, the metal wire 50 is disposed the same layer as the source-drain electrode layer 127. Generally, the source-drain metal layer 127 is made of molybdenum aluminum molybdenum and has a smaller sheet resistance, and such configuration helps reduce the loss of the touch signal on the metal wire 50 and improves the transmit efficiency of the touch signal.

On the basis of the same concept, an embodiment of the present disclosure further provides a display device. This display device includes the touch display panel according to any embodiment of the present disclosure. Therefore, the display device provided by this embodiment of the present disclosure has the corresponding beneficial effects of the touch display panel provided by the embodiment of the present disclosure, which is not repeated here. Exemplarily, the display device may be a mobile phone, a computer, a smart wearable device (for example, a smart watch), an onboard display device, and other electronic devices, which is not limited in this embodiment of the present disclosure.

Figure 20:
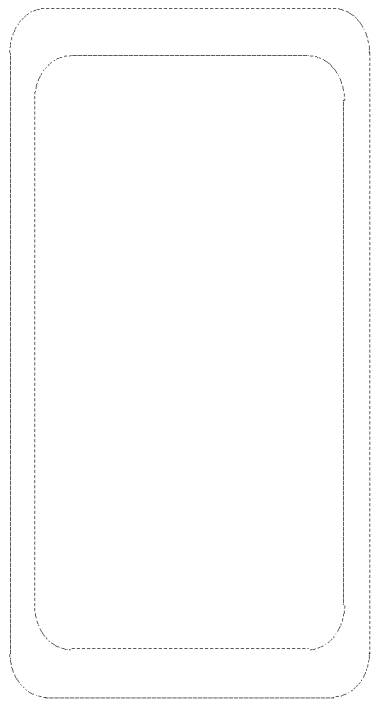
FIG. 20 is a structural diagram of a display device according to an embodiment of the present disclosure.

Exemplarily, FIG. 20 is a structural diagram of a display device according to an embodiment of the present disclosure. Referring to FIG. 20, the display device includes the touch display panel and the touch drive chip (not shown in FIG. 20) of any embodiment of the present disclosure, and the metal wire (not shown in FIG. 20) in the touch display panel is electrically connected to the touch drive chip. The touch drive chip may be integrated and embedded into the drive chip of the touch display panel. Alternatively, the touch drive chip may be configured independently of the touch display panel, and signals may be transmitted between the touch drive chip and the touch display panel via electrical connection wires. This is not limited in this embodiment of the present disclosure.

It is to be noted that the above are merely preferred embodiments of the present disclosure and the technical principles used therein. It is to be understood by those skilled in the art that the present disclosure is not limited to the specific embodiments described herein. Those skilled in the art can make various apparent modifications, adaptations and substitutions without departing from the scope of the present disclosure. Therefore, while the present disclosure has been described in detail through the preceding embodiments, the present disclosure is not limited to the preceding embodiments and may further include more other equivalent embodiments without departing from the concept of the present disclosure. The scope of the present disclosure is determined by the scope of the appended claims.

What is claimed is:

1. A touch display panel, comprising: a first substrate and a second substrate opposite to each other, wherein a display area and a non-display area are formed on each of the first substrate and the second substrate;
    wherein in the non-display area of the first substrate, a plurality of first conductive structures and a plurality of metal wires are disposed on the side of the first substrate facing the second substrate, and wherein a plurality of second conductive structures are disposed on one side of the second substrate facing the first substrate, wherein each of the plurality of first conductive structures is electrically connected to at least one of the plurality of second conductive structures;
    wherein in the display area, a plurality of pixel units are disposed on the one side of the first substrate, touch electrodes are disposed on the one side of the second substrate facing the first substrate, each of the plurality of second conductive structures is electrically connected to at least one of the touch electrodes, and the plurality of metal wires are configured to transmit touch signals; and
    wherein each of the plurality of first conductive structures comprises a first transmit electrode and a first gasket structure, the first gasket structure is disposed between the first transmit electrode and the first substrate, and the first transmit electrode is electrically connected to one of the plurality of metal wires and one of the plurality of second conductive structures; wherein the first gasket structure comprises a plurality of first support portions, and a first recessed portion is disposed between two adjacent said first support portions.

2. The touch display panel of claim 1, wherein each of the plurality of second conductive structures comprises a second transmit electrode and a second gasket structure disposed between the second transmit electrode and the second substrate, and wherein the second transmit electrode is electrically connected to the touch electrode and the first transmit electrode; and
    wherein the second gasket structure comprises a plurality of second support portions, wherein a second recessed portion is disposed between two adjacent said second support portions.

3. The touch display panel of claim 2, wherein the first gasket structure comprises a first sub-gasket structure and a second sub-gasket structure, the first sub-gasket structure is configured on one side of the second sub-gasket structure facing away from the first substrate, the second sub-gasket structure comprises a third transmit electrode, and the third transmit electrode is electrically connected to one of the plurality of metal wires;
    wherein each of the plurality of first recessed portions penetrates one of the first sub-gasket structure along a direction perpendicular to the first substrate, so that the third transmit electrode is exposed;
    wherein the second gasket structure comprises a third sub-gasket structure and a fourth sub-gasket structure, the third sub-gasket structure is formed on one side of the fourth sub-gasket structure facing away from the second substrate, the fourth sub-gasket structure comprises a fourth transmit electrode, and the fourth transmit electrode is electrically connected to the touch electrode; and
    wherein each of the plurality of second recessed portions penetrates the third sub-gasket structure along the direction perpendicular to the first substrate so that the fourth transmit electrode is exposed.

4. The touch display panel of claim 2, wherein in the non-display area, a first connection structure is disposed on the one side of the first substrate facing the second substrate, wherein the first connection structure and the first transmit electrode are disposed in a same layer and electrically connected to each other, and a distance between a plane in which the first connection structure is located and a plane in which the respective one of the plurality of metal wires is located is less than a distance between a plane in which the first transmit electrode is located and the plane in which the respective one of the plurality of metal wires is located;
    wherein an orthographic projection of the respective one of the plurality of metal wires onto the first substrate is within an orthographic projection of the first connection structure onto the first substrate, and wherein the first connection structure is electrically connected to the respective one of the plurality of metal wires through a via hole;
    wherein in the non-display area, a touch wire and a second connection structure are configured on the one side of the second substrate facing the first substrate, wherein the touch wire is electrically connected to a respective one of the touch electrodes, wherein the second connection structure and the second transmit electrode are disposed in a same layer and electrically connected to each other, and wherein a distance between a plane in which the second connection structure is located and a plane in which the touch wire is located is less than a distance between a plane in which the second transmit electrode is located and the plane in which the touch wire is located;
    wherein an orthographic projection of the touch wire onto the second substrate is within an orthographic projection of the second connection structure onto the second substrate; and
    wherein the second connection structure is electrically connected to the touch wire through a via hole.

5. The touch display panel of claim 2, wherein an orthographic projection of the first support portion onto the first substrate is at least partially overlapped with an orthographic projection of the second support portion onto the first substrate.

6. The touch display panel of claim 5, wherein the orthographic projection of the first support portion onto the first substrate overlaps with the orthographic projection of the second support portion onto the first substrate.

7. The touch display panel of claim 5, wherein the first support portions are not connected to each other, the second support portions are not connected to each other, wherein each of the first support portions is associated with one of the second support portions, and the orthographic projection of the first support portion onto the first substrate overlaps partially with the orthographic projection of the second support portion onto the first substrate.

8. The touch display panel of claim 7, wherein the orthographic projection of the first support portion onto the first substrate has at least one of a rectangular shape, a circular shape, an oval shape and a ring shape, and wherein the orthographic projection of the second support portion onto the first substrate has at least one of a rectangular shape, a circular shape, an oval shape and a ring shape.

9. The touch display panel of claim 5, wherein the first support portions are integrally connected with each other, and the second support portions are integrally connected with each other.

10. The touch display panel of claim 9, wherein the first support portions are connected to form a mesh and the second support portions are connected to form a mesh.

11. The touch display panel of claim 5, wherein the orthographic projection of the first support portion onto the first substrate is enclosed in the orthographic projection of the second support portion onto the first substrate; or
wherein the orthographic projection of the second support portion onto the first substrate is enclosed within the orthographic projection of the first support portion onto the first substrate.

12. The touch display panel of claim 11, wherein an orthographic projection of a center point of the first support portion onto the first substrate is coincident with an orthographic projection of a center point of the second support portion onto the first substrate.

13. The touch display panel of claim 2, wherein an orthographic projection of one of the first support portion onto the first substrate at least partially overlaps with an orthographic projections of one of the plurality of second recessed portions onto the first substrate.

14. The touch display panel of claim 13, wherein the orthographic projection of the first support portion onto the first substrate overlaps with the orthographic projections of the plurality of second recessed portions onto the first substrate.

15. The touch display panel of claim 13, wherein the first support portion has a same height as the second support portion along a normal direction of the display panel.

16. The touch display panel of claim 1, wherein in the display area, an active layer, a gate insulating layer, a gate metal layer, an interlayer insulating layer, a capacitance metal layer, an interlayer dielectric layer, a source-drain metal layer, a passivation layer, a planarization layer and an anode metal layer are sequentially disclosed on the first substrate; and
wherein the active layer shares a same layer with a first film of the first gasket structure, wherein the gate insulating layer shares a same layer with a second film of the first gasket structure, wherein the gate metal layer shares a same layer with a third film of the first gasket structure, wherein the interlayer insulating layer shares a same layer as a fourth film of the first gasket structure, wherein the capacitance metal layer shares a same layer with a fifth film of the first gasket structure, wherein the interlayer dielectric layer shares a same layer with a sixth film of the first gasket structure, wherein the source-drain metal layer shares a same layer with a seventh film of the first gasket structure, wherein the passivation layer shares a same layer with an eighth film of the first gasket structure, wherein the planarization layer shares a same layer with a ninth film of the first gasket structure, wherein the anode metal layer shares a same layer with the first transmit electrode, and wherein a tenth film of the first gasket structure is disposed between the first transmit electrode and the ninth film of the first gasket structure.

17. The touch display panel of claim 16, wherein each of the plurality of first recessed portions either penetrates the ninth film and the tenth film of the first gasket structure, or penetrates partially the tenth film of the first gasket structure.

18. The touch display panel of claim 2, wherein in the display area, the second substrate is further provided with a touch electrode layer and a protection layer sequentially; and
wherein the touch electrode layer shares a same layer with a first film of the second gasket structure, the protection layer shares a same layer with a second film of the second gasket structure, and a third film of the second gasket structure is disposed between the second film of the second gasket structure and the second transmit electrode.

19. The touch display panel of claim 2, wherein in the display area, the second substrate is further provided with a black matrix, a color resist layer, a flat layer, a touch electrode layer and a first insulating layer sequentially; and
wherein the black matrix shares a same layer as a first film of the second gasket structure, the color resist layer shares a same layer with a second film of the second gasket structure, the flat layer shares a same layer with a third film of the second gasket structure, the touch electrode layer shares a same layer with a fourth film of the second gasket structure, the first insulating layer is shares a same layer with a fifth film layer of the second gasket structure, and a sixth film of the second gasket structure is disposed between the fifth film of the second gasket structure and a second conductive layer.

20. A display device, comprising a touch display panel and a touch drive chip, wherein the touch display panel comprises:
a display area, a non-display area, and a first substrate and a second substrate disposed opposite to the first substrate;
wherein in the non-display area, a plurality of first conductive structures and a plurality of metal wires are disposed on one side of the first substrate facing the second substrate, and a plurality of second conductive structures are configured on one side of the second substrate facing the first substrate, wherein each of the plurality of first conductive structures is electrically connected to at least one of the plurality of second conductive structures;
wherein in the display area, a plurality of pixel units are configured on the one side of the first substrate, touch electrodes are disposed on the one side of the second substrate facing the first substrate, each of the plurality of second conductive structures is electrically connected to at least one of the touch electrodes, and the plurality of metal wires are disposed to transmit touch signals;

wherein each of the plurality of first conductive structures comprises a first transmit electrode and a first gasket structure, the first gasket structure is disposed between the first transmit electrode and the first substrate, and the first transmit electrode is electrically connected to a respective one of the plurality of metal wires and the respective one of the plurality of second conductive structures, wherein the first gasket structure comprises a plurality of first support portions, and a first recessed portion is disposed between two adjacent said first support portions; and wherein the plurality of metal wires are electrically connected to the touch drive chip.

* * * * *